(12) United States Patent
Singh et al.

(10) Patent No.: US 11,545,407 B2
(45) Date of Patent: Jan. 3, 2023

(54) THERMAL MANAGEMENT SOLUTIONS FOR INTEGRATED CIRCUIT PACKAGES

(71) Applicant: Intel Corporation, Santa Clara, CA (US)

(72) Inventors: Kumar Abhishek Singh, Phoenix, AZ (US); Omkar Karhade, Chandler, AZ (US); Nitin Deshpande, Chandler, AZ (US); Mitul Modi, Phoenix, AZ (US); Edvin Cetegen, Chandler, AZ (US); Aastha Uppal, Chandler, AZ (US); Debendra Mallik, Chandler, AZ (US); Sanka Ganesan, Chandler, AZ (US); Yiqun Bai, Chandler, AZ (US); Jan Krajniak, Phoenix, AZ (US); Manish Dubey, Chandler, AZ (US); Ravindranath Mahajan, Chandler, AZ (US); Ram Viswanath, Phoenix, AZ (US); James C. Matayabas, Jr., Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 16/244,748

(22) Filed: Jan. 10, 2019

(65) Prior Publication Data
US 2020/0227332 A1 Jul. 16, 2020

(51) Int. Cl.
*H01L 23/10* (2006.01)
*H01L 23/34* (2006.01)
(Continued)

(52) U.S. Cl.
CPC .......... *H01L 23/34* (2013.01); *H01L 21/4875* (2013.01); *H01L 21/563* (2013.01); *H01L 21/565* (2013.01); *H01L 23/3114* (2013.01); *H01L 23/3121* (2013.01); *H01L 23/3157* (2013.01); *H01L 23/481* (2013.01); *H01L 24/09* (2013.01); *H01L 24/17* (2013.01); *H01L 24/73* (2013.01)

(58) Field of Classification Search
CPC . H01L 23/34; H01L 23/3114; H01L 23/3121; H01L 23/563
USPC .......................................................... 257/706
See application file for complete search history.

(56) References Cited

U.S. PATENT DOCUMENTS

| 5,909,056 A * | 6/1999 | Mertol ................. H01L 23/3675 257/796 |
| 6,534,859 B1 * | 3/2003 | Shim .................... H01L 23/3128 257/796 |

(Continued)

*Primary Examiner* — Nitin Parekh
(74) *Attorney, Agent, or Firm* — Essential Patents Group, LLP.

(57) ABSTRACT

An integrated circuit package may be formed having at least one heat dissipation structure within the integrated circuit package itself. In one embodiment, the integrated circuit package may include a substrate; at least one integrated circuit device, wherein the at least one integrated circuit device is electrically attached to the substrate; a mold material on the substrate and adjacent to the at least one integrated circuit device; and at least one heat dissipation structure contacting the at least one integrated circuit, wherein the at least one heat dissipation structure is embedded either within the mold material or between the mold material and the substrate.

20 Claims, 12 Drawing Sheets

(51) Int. Cl.
*H01L 23/31* (2006.01)
*H01L 23/00* (2006.01)
*H01L 23/48* (2006.01)
*H01L 21/56* (2006.01)
*H01L 21/48* (2006.01)

(56) References Cited

U.S. PATENT DOCUMENTS

| | | | |
|---|---|---|---|
| 6,720,649 B2* | 4/2004 | Huang | H01L 23/4334 |
| | | | 257/796 |
| 7,002,246 B2* | 2/2006 | Ho | H01L 23/36 |
| | | | 257/E23.101 |
| 7,126,218 B1* | 10/2006 | Darveaux | H01L 23/367 |
| | | | 257/691 |
| 7,190,066 B2* | 3/2007 | Huang | H01L 23/4334 |
| | | | 257/E23.101 |
| 7,498,203 B2* | 3/2009 | Haga | H01L 23/24 |
| | | | 438/122 |
| 2008/0073778 A1* | 3/2008 | Edwards | H01L 23/4334 |
| | | | 257/E23.092 |
| 2012/0280374 A1* | 11/2012 | Choi | H01L 23/49827 |
| | | | 257/659 |
| 2015/0115433 A1* | 4/2015 | Lin | H01L 23/5389 |
| | | | 438/122 |
| 2015/0118794 A1* | 4/2015 | Lin | H01L 21/561 |
| | | | 438/107 |
| 2015/0382448 A1* | 12/2015 | Pennathur | H05K 1/0203 |
| | | | 361/679.54 |
| 2017/0194268 A1* | 7/2017 | Ho | H01L 24/11 |

* cited by examiner

THERMAL MANAGEMENT SOLUTIONS FOR INTEGRATED CIRCUIT PACKAGES

TECHNICAL FIELD

Embodiments of the present description generally relate to the removal of heat from integrated circuit packages, and, more particularly, to thermal management solutions for hot spots within integrated circuit devices within the integrated circuit packages.

BACKGROUND

Higher performance, lower cost, increased miniaturization, and greater packaging density of integrated circuits within integrated circuit devices are ongoing goals of the electronics industry. As these goals are achieved, the density of power consumption of components within the integrated circuit devices has increased, which, in turn, increases the average junction temperature of the integrated circuit device. If the temperature of the integrated circuit device becomes too high, circuits within the integrated circuit device may be damaged or destroyed. This is particularly problematical when the integrated circuit device of the integrated circuit package has a specific area or areas that generate greater heat than other areas of the integrated circuit device during operation. These areas are known as hot spots and are particularly susceptible to thermal damage. Thus, heat spreaders may be attached to the integrated circuit package to remove heat. However, the use of heat spreaders may be impractical in some applications for technical and/or cost reasons. For example, where an integrated circuit package has an interposer or other integrated circuit device(s) stacked on the integrated circuit device of the integrated circuit package that would prevent at use of known heat spreaders.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
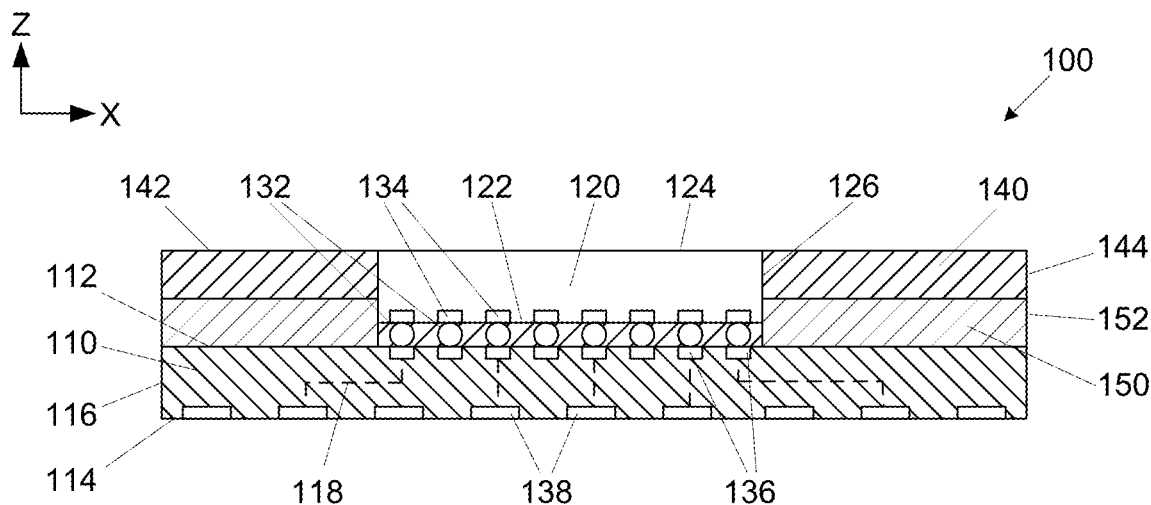
FIG. 1 is a side cross-sectional view of an integrated circuit assembly having a heat dissipation structure formed between a mold material and a substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad.

The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include integrated circuit packages having at least one heat dissipation structure within the integrated circuit package itself, and methods of fabricating the same. In one embodiment, the integrated circuit packages may include a substrate, at least one integrated circuit device electrically attached to the substrate, a mold material on the substrate and adjacent the at least one integrated circuit device, and at least one heat dissipation structure contacting the at least one integrated circuit device, wherein the at least one heat dissipation structure is embedded either within the mold material or between the mold material and the substrate.

FIG. 1 illustrates an integrated circuit package or assembly 100 having at least one integrated circuit device 120 electrically attached to a first substrate 110, such as in a configuration generally known as a flip-chip or controlled collapse chip connection ("C4") configuration, according to an embodiment of the present description.

The first substrate 110 may be any appropriate structure, including, but not limited to, an interposer. The first substrate 110 may have a first surface 112 and an opposing second surface 114, and a side 116 extending between the first surface 112 and the second surface 114. The first substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The first substrate 110 may further include conductive routes 118 or "metallization" (shown in dashed lines) extending through the first substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the first substrate 110 may be a cored substrate or a coreless substrate.

The at least one integrated circuit device 120 may be any appropriate device, including, but not limited to, a microprocessor, a chipset, a graphics device, a wireless device, a memory device, an application specific integrated circuit, combinations thereof, stacks thereof, or the like. As shown, the integrated circuit device 120 may have a first surface 122, an opposing second surface 124, and at least one side 126 extending between the first surface 122 and the second surface 124.

In an embodiment of the present description, the integrated circuit device 120 may be electrically attached to the first substrate 110 with a plurality of device-to-substrate interconnects 132. In one embodiment of the present description, the device-to-substrate interconnects 132 may extend between bond pads 136 on the first surface 112 of the first substrate 110 and bond pads 134 on the first surface 122 of the integrated circuit device 120. The device-to-substrate interconnects 132 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

The bond pads 134 may be in electrical communication with integrated circuitry (not shown) within the integrated circuit device 120. The bond pads 136 on the first surface 112 of the first substrate 110 may be in electrical contact with the conductive routes 118. The conductive routes 118 may extend through the first substrate 110 and be connected to bond pads 138 on the second surface 114 of the first substrate 110. As will be understood to those skilled in the art, the first substrate 110 may reroute a fine pitch (center-to-center distance between the bond pads) of the bond pads 136 on the first surface 112 of the integrated circuit device 120 to a relatively wider pitch of the bond pads 138 on the second surface 114 of the first substrate 110.

As shown in FIG. 1, after the attachment of the integrated circuit device 120, an electrically insulative mold material 140 may be disposed on the first substrate 110 and the integrated circuit device 120. In one embodiment of the present description, the mold material 140 may substantially encapsulate the integrated circuit device 120. In another embodiment, the mold material 140 may flow between the integrated circuit device 120 and the first substrate 110, which may assist with preventing contamination of the device-to-substrate interconnects 132 and/or assist with overcoming the mechanical stress issues that can arise from thermal expansion mismatch between the first substrate 110 and the integrated circuit device 120. The mold material 140 may be any appropriate encapsulation material, such as an epoxy resins and filled epoxy resins. The mold material 140 may be formed by any known method, such as mold material injection into a mold chase, as will be understood to those skilled in the art. In a further embodiment of the present description, a first surface 142 of the mold material 140 may be substantially planar with the second surface 124 of the integrated circuit device 120, e.g. residing in substantially in a common plane.

In the embodiments of the present description, at least one heat dissipation structure 150 may be incorporated into the integrated circuit assembly 100. As shown in FIG. 1, the at least one heat dissipation structure 150 may be formed on the first surface 112 of the first substrate 110 prior to forming the mold material 140 thereon, and may contact the at least one side 126 of the integrated circuit device 120 and may extend to the at least one side 116 of the first substrate 110. In one embodiment, the at least one side 116 of the first substrate 110, at least one side 144 of the mold material 140, and an edge 152 of the at least one heat dissipation structure 150 may be substantially planar with one another, e.g. residing substantially in a common plane. The heat dissipation structure 150 may be made of any appropriate highly thermally conductive material, including, but not limited to metals, such as copper, aluminum, alloys thereof, and the like. The heat dissipation structure 150 may be fabricated by any know method, including, but not limited to sputtering, vapor deposition, plating, printing, dispensing, coating, lamination, rolling, and the like, onto desired areas. In one embodiment, metal inks may be used to form the heat dissipation structure 150, wherein the metal ink may be deposited using an ink-jet printing technique and then converted into solid metal with a reflow or solution dipping process, as known in the art. The processes for metal ink application are well known in the art and for purposes of clarity and conciseness will not be discussed or illustrated herein.

Figure 2:
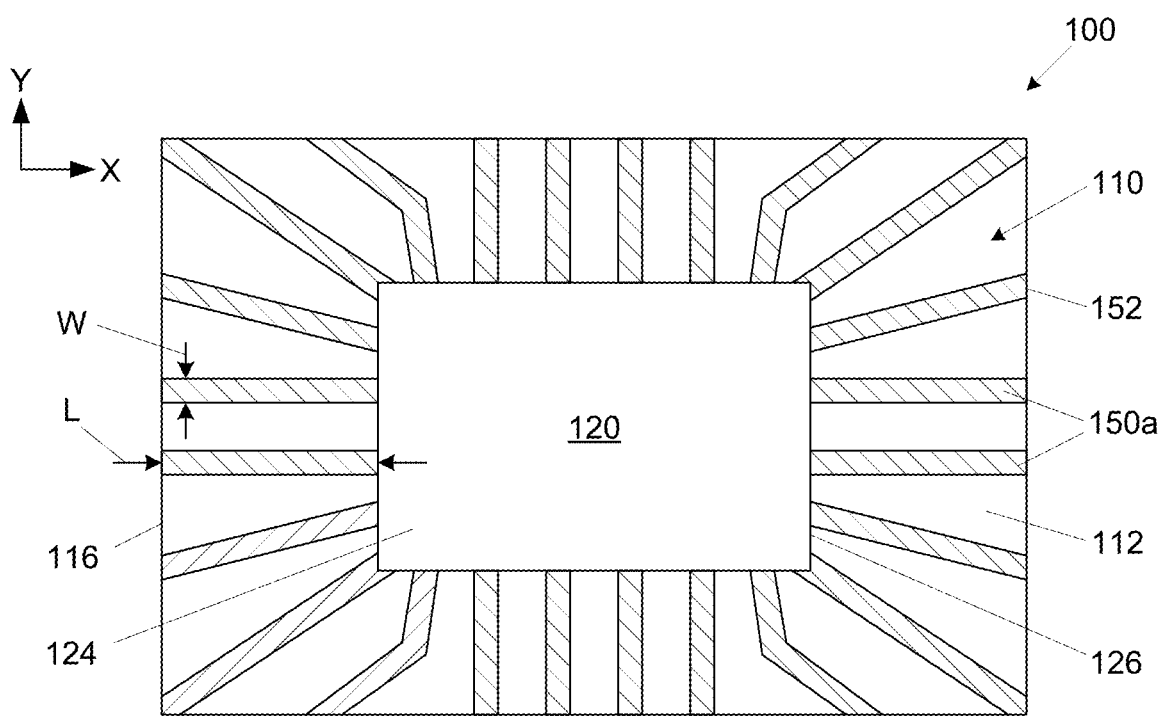
FIGS. 2-5 is a top plan view of FIG. 1 without the mold material, according to various embodiments of the present description.
Figure 3:
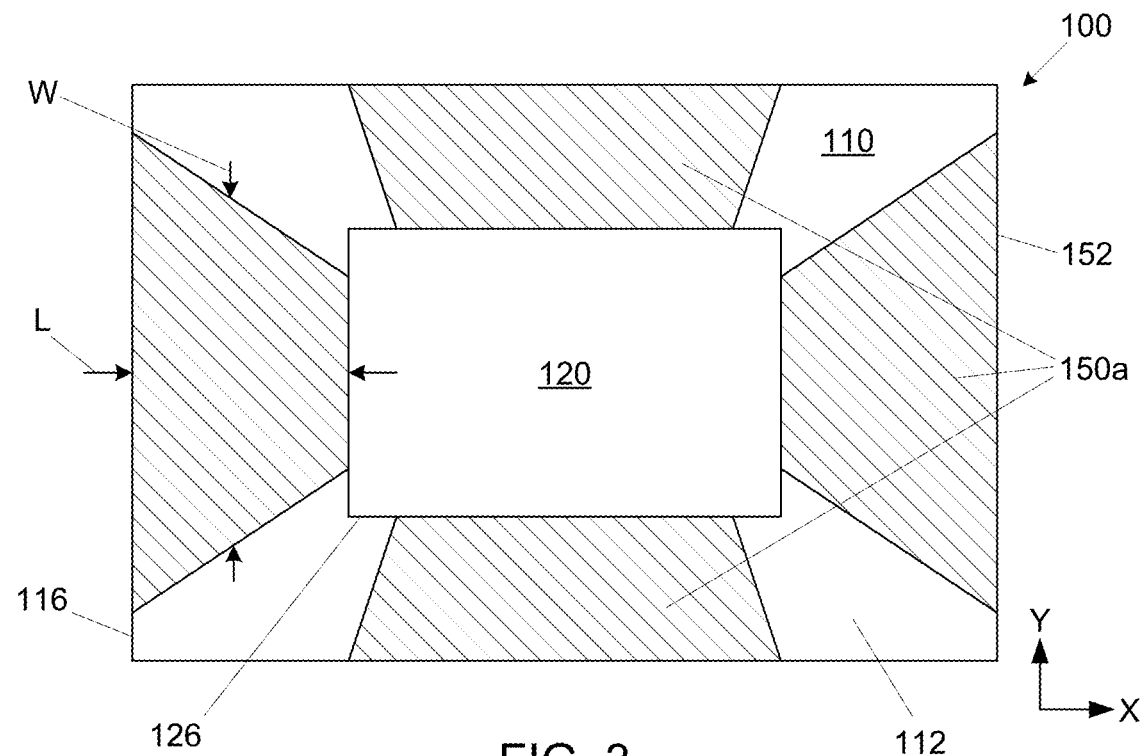

The heat dissipation structure 150 may have any appropriate configuration in the X-Y directions (see FIG. 2). In the embodiment illustrated in FIG. 2 (illustrated without the mold material 140 for clarity), the heat dissipation structure 150 (see FIG. 1) may be a plurality of thermally conductive routes 150a extending from the integrated circuit device 120 to the at least one side 116 of the first substrate 110. In one embodiment, the thermally conductive routes 150a may be substantially symmetrically distributed around the integrated circuit device 120. In the embodiment illustrated in FIG. 2, an average width W of each thermally conductive route 150a may be less than the average length L (e.g. average length of the path of travel from the integrated circuit device 120 to the at least one side 116 of the first substrate 110) of each thermally conductive route 150a. In the embodiment of FIG. 3, the average width W of each thermally conductive route 150a may be greater than the average length L (e.g. average length of travel from the integrated circuit device 120 to the at least one side 116 of the first substrate 110) of each thermally conductive route 150a. In a further embodiment shown in FIG. 4, the heat dissipation structure 150 may simply be single structure that substantially surrounds the integrated circuit device 120 and extends from the integrated circuit device 120 to the at least one side 116 of the first substrate 110.

Figure 4:
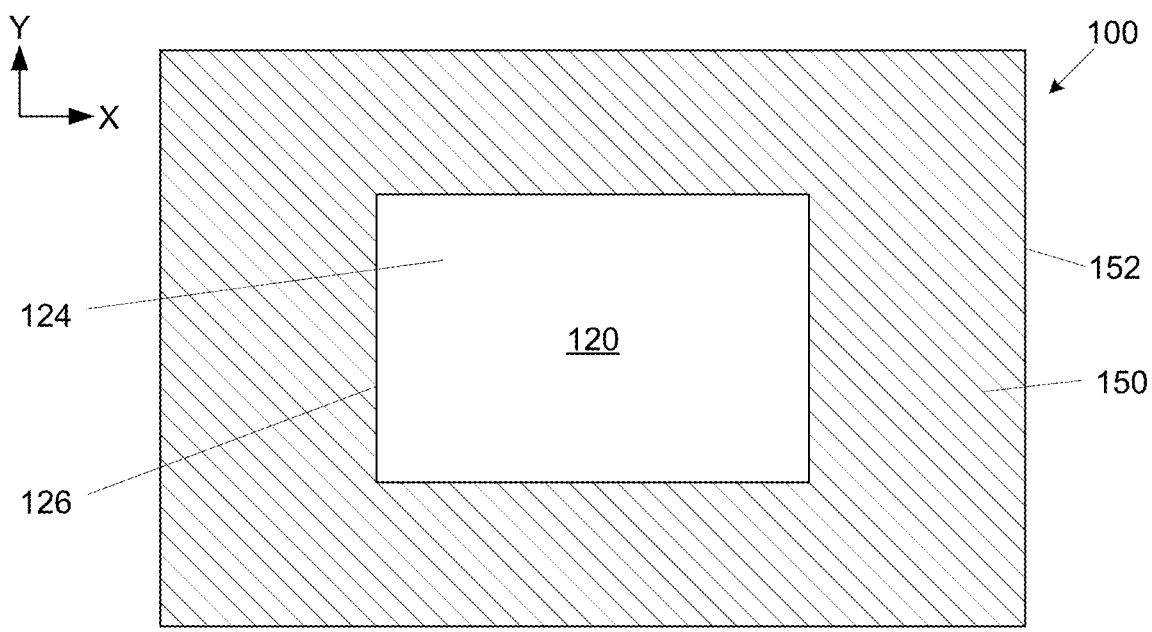
Figure 5:
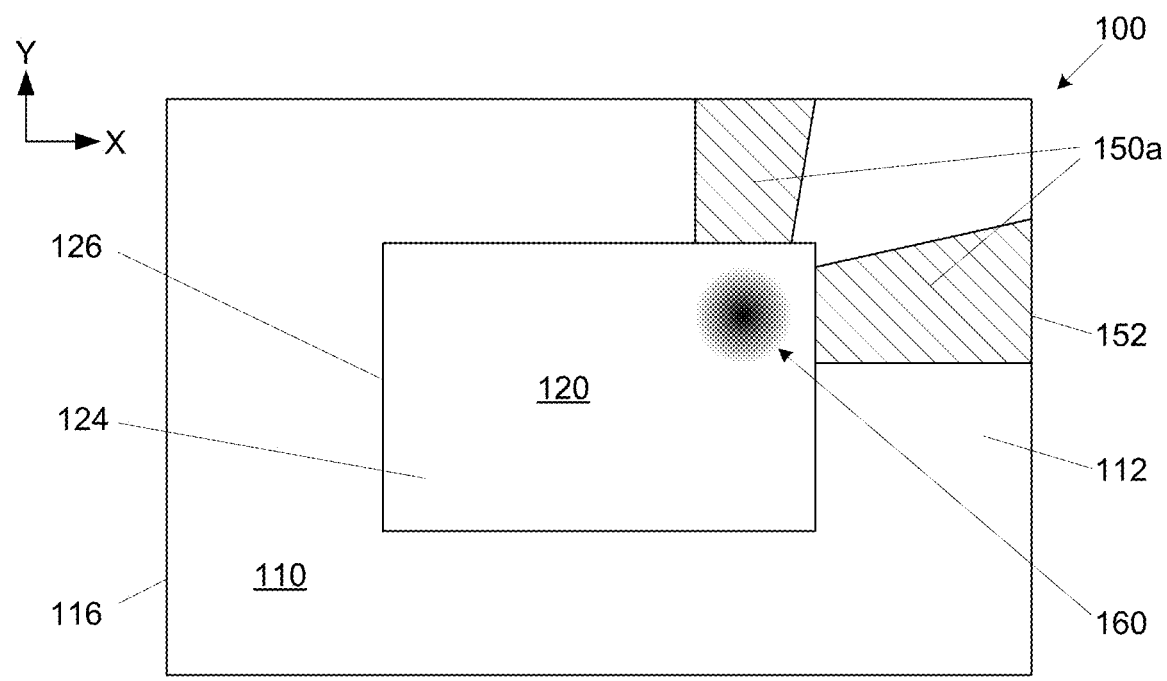

The embodiments of the present description shown in FIGS. 2-4 are configurations of the heat dissipation structure 150 which may dissipate heat from the integrated circuit device 120 in a relatively uniform manner. However, the embodiments of the present description may be directed to configurations which remove heat from hotspots 160 within the integrated circuit device 120, as shown in FIG. 5. In one embodiment, the heat dissipation structure 150 may be at least one thermally conductive route 150a extending from a position proximate the hotspot 160 within the integrated circuit device 120 to the at least one side 116 of the first substrate 110.

Figure 6:
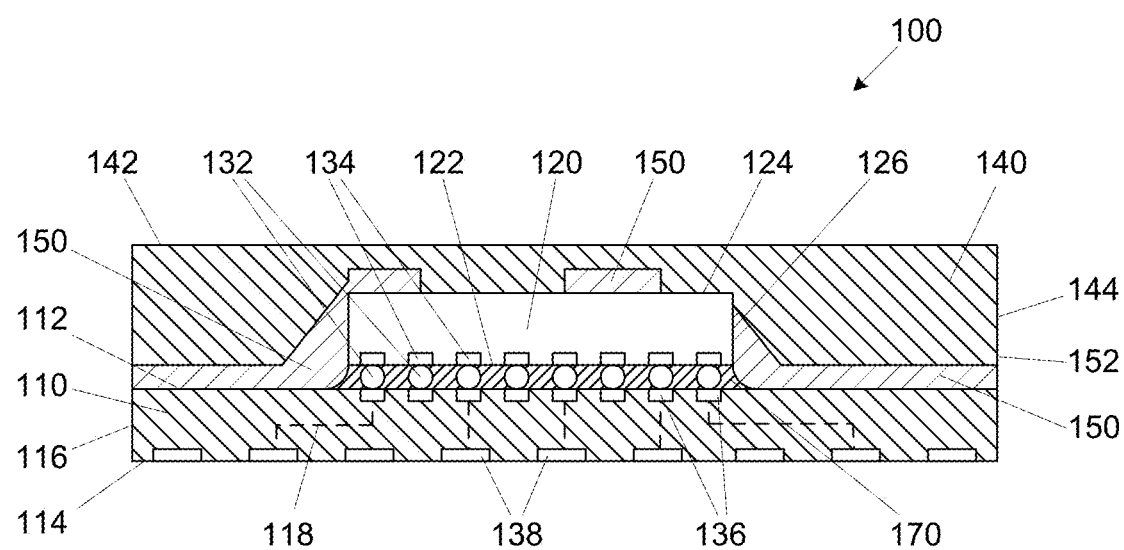
FIG. 6 is a side cross-sectional view of an integrated circuit assembly having a heat dissipation structure formed between a mold material and a substrate, onto the integrated circuit device of the integrated circuit assembly, and extending through the mold material of the integrated circuit assembly, according to an embodiment of the present description.

In another embodiment as shown in FIG. 6, the heat dissipation structure 150 may further extend over at least a portion of the second surface 124 of the integrated circuit device 120. In one embodiment, an electrically-insulating underfill material 170 may be disposed between the integrated circuit device 120 and the first substrate 110 prior to the formation of the heat dissipation structure 150. The underfill material 170 may be used to overcome the mechanical stress issues that can arise from thermal expansion mismatch between the first substrate 110 and the integrated circuit device 120.

Figure 7:
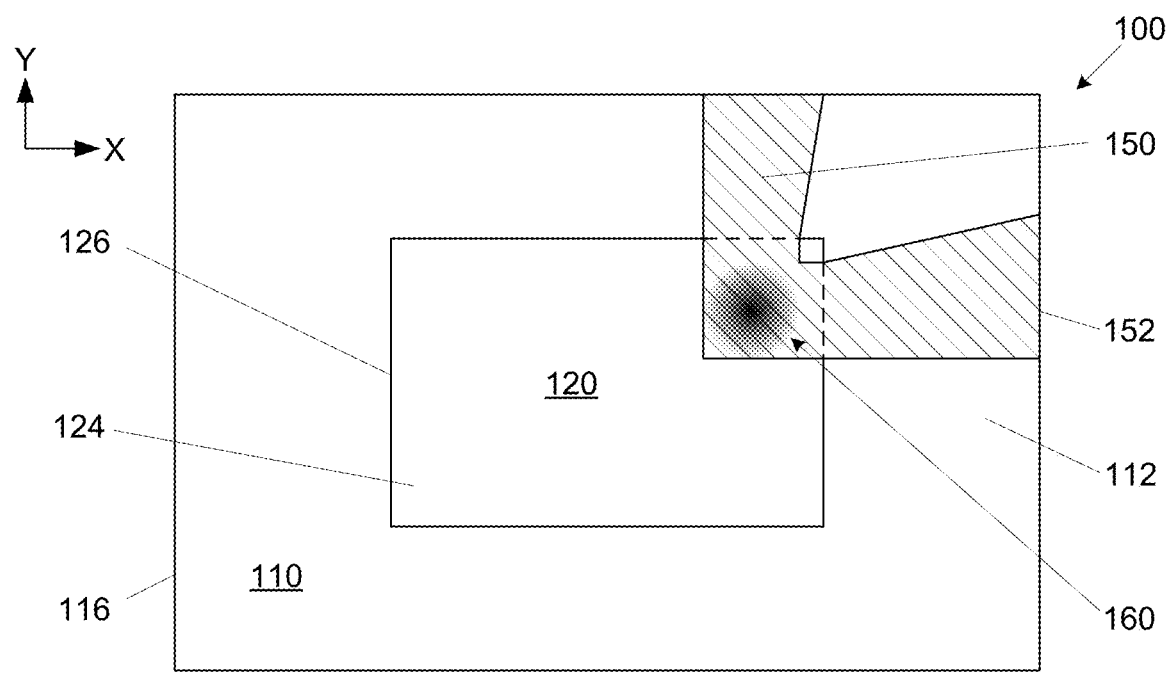
FIG. 7 is a top plan view of FIG. 6 without the mold material, according to an embodiment of the present description.

As shown in FIG. 7, embodiments of the heat dissipation structure of FIG. 6 may be directed to configurations which remove heat from hotspots 160 within the integrated circuit device 120. In one embodiment, the heat dissipation structure 150 may be at least one thermally conductive route extending from a position proximate at least one hotspot 160 within the integrated circuit device 120 on the second surface 124 of the integrated circuit device 120 to the at least one side 116 of the first substrate 110.

Figure 8:
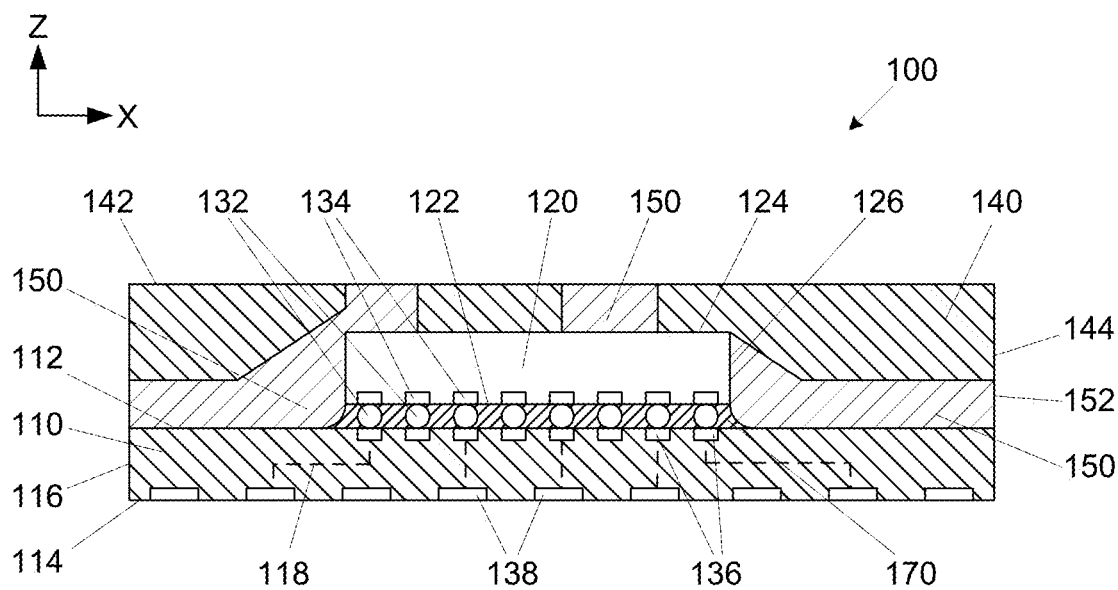
FIG. 8 is a side cross-sectional view of an integrated circuit assembly having a heat dissipation assembly formed between a mold material and a substrate and extending through the mold material of the integrated circuit assembly, according to an embodiment of the present description.

As shown in FIG. 8, embodiments of the heat dissipation structure of FIG. 6 may be directed to configurations which also removes heat from hotspots 160 within the integrated circuit device 120 in a Z direction. In one embodiment, the heat dissipation structure 150 may extend from the second surface 124 of the integrated circuit device 120 to the first surface 142 of the mold material 140.

Figure 9:
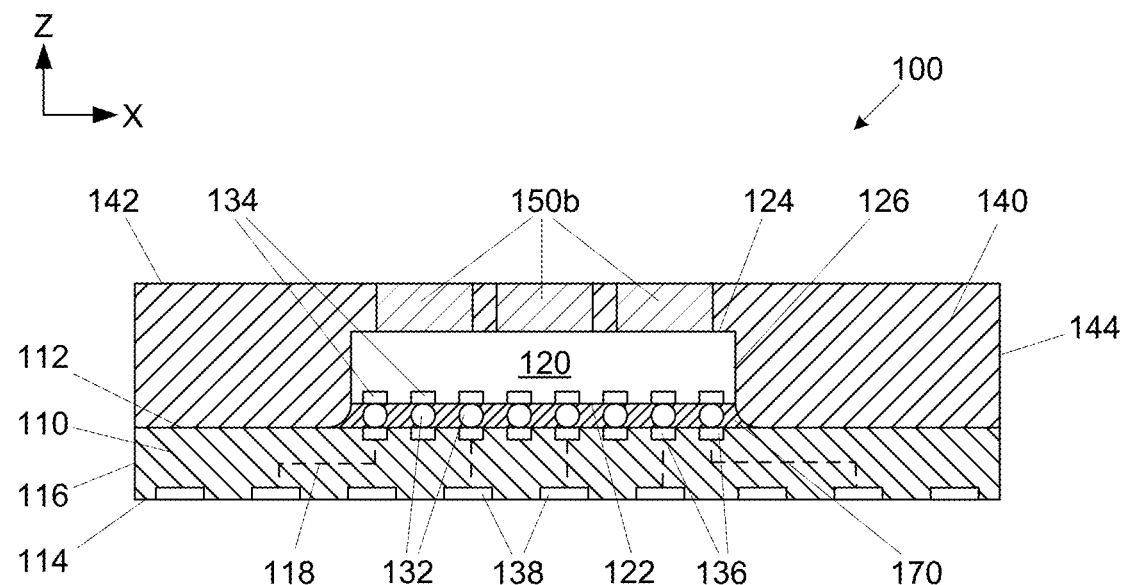
FIG. 9 is a side cross-sectional view of an integrated circuit assembly having a heat dissipation structure formed through a mold material of the integrated circuit assembly, according to an embodiment of the present description.
Figure 10:
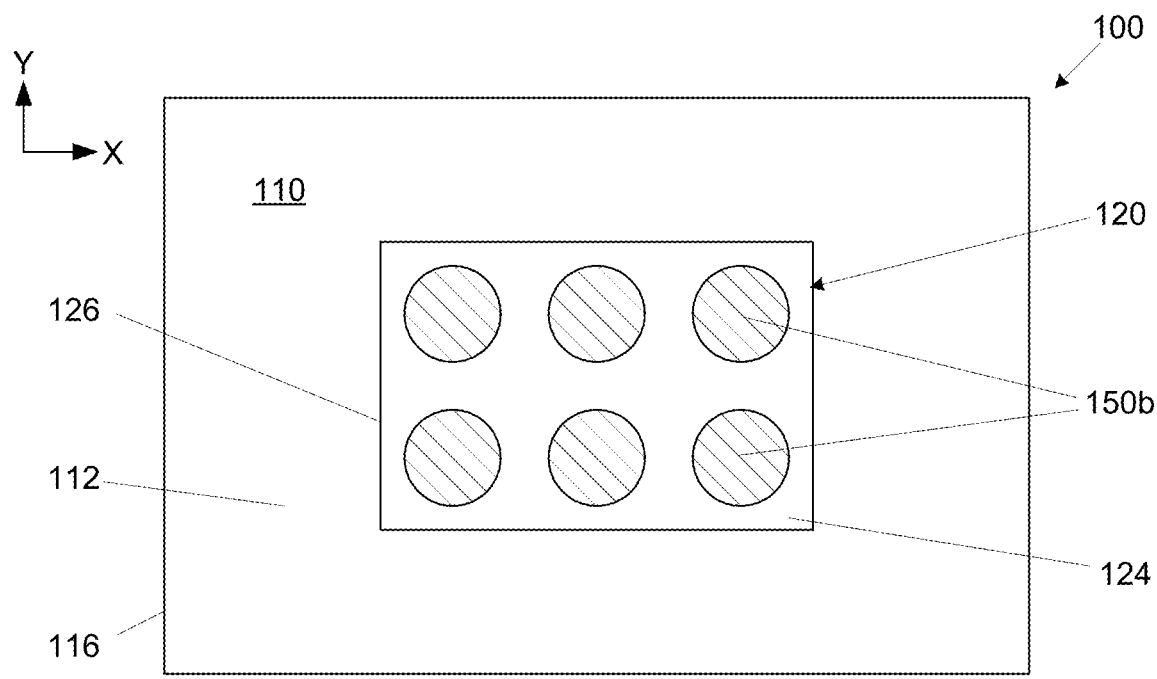
FIG. 10 is a top plan view of FIG. 9 without the mold material, according to an embodiment of the present description.

As shown in FIGS. 9 and 10, embodiments of the present description may be directed to the configurations which removes in the Z direction. In one embodiment, the heat dissipation structure may comprise a plurality of heat dissipation components 150b may extend from the second surface 124 of the integrated circuit device 120 to the first surface 142 of the mold material 140.

Figure 11:
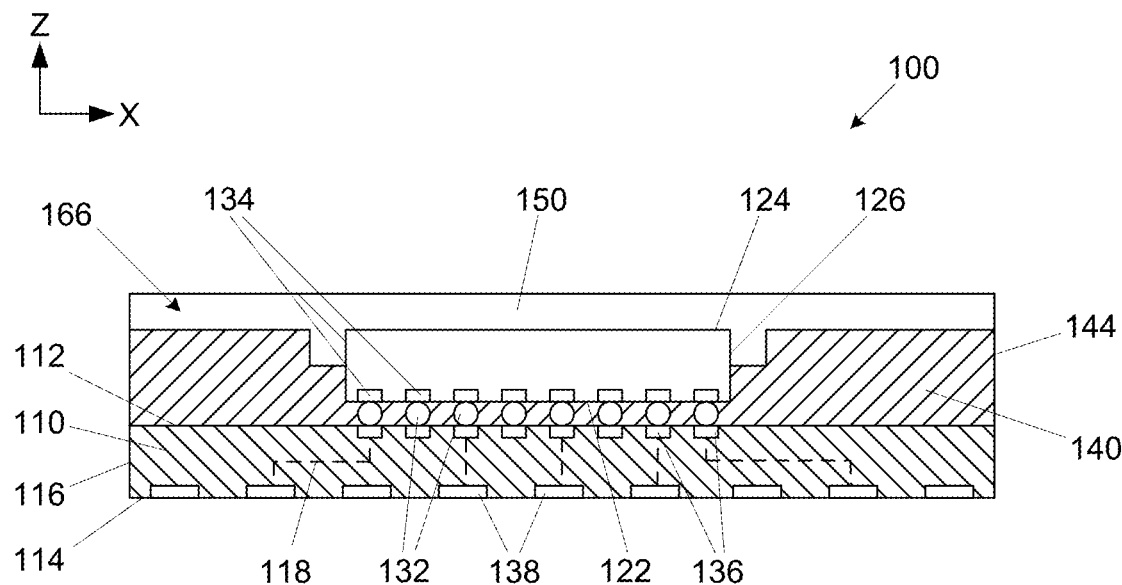
FIGS. 11 and 12 are side cross-sectional views of an integrated circuit assembly having a recess formed in a mold material of the integrated circuit assembly, as shown in FIG. 11, and a heat dissipation structure formed in the recess, according to an embodiment of the present description.
Figure 12:
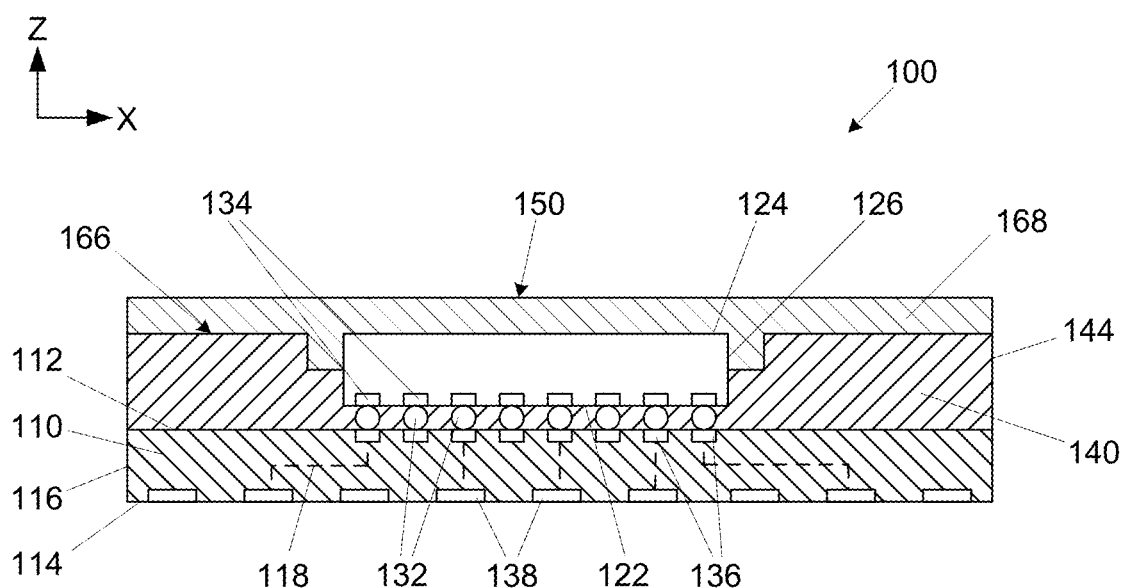

As shown in FIGS. 11 and 12, embodiments of the present description may be directed to configurations of the heat dissipation structure 150 that is formed within the mold material 140. In one embodiment, the heat dissipation structure 150 may be formed by forming a recess 166 within the mold material 140 to expose at least a portion of the second surface 124 of the integrated circuit device 120, as shown in FIG. 11, and depositing a thermally conductive material 168 in the recess 166, as shown in FIG. 12.

Figure 13:
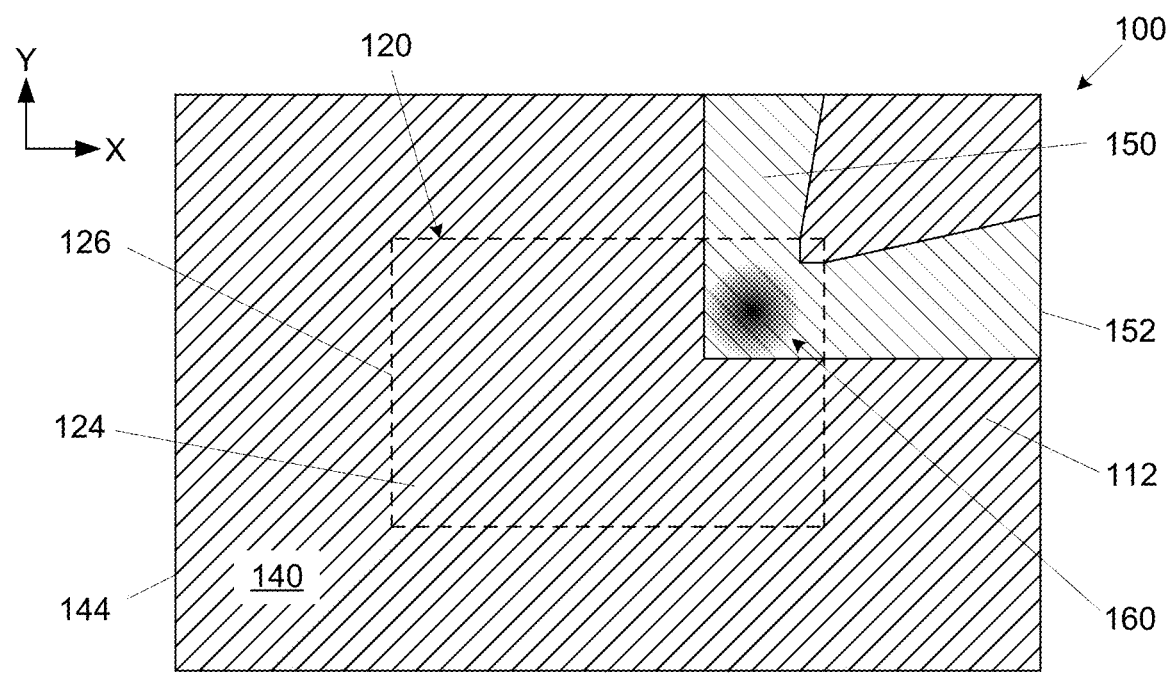
FIG. 13 is a top plan view of FIG. 12, according to an embodiment of the present description.

As shown in FIG. 13, embodiments of the heat dissipation structure of FIG. 12 may be directed to configurations which remove heat from hotspots 160 within the integrated circuit device 120. In one embodiment, the heat dissipation structure 150 may be at least one thermally conductive route extending from a position proximate the hotspot 160 within the integrated circuit device 120 on the second surface 124 of the integrated circuit device 120 to the at least one side 144 of the mold material 140.

Figure 14:
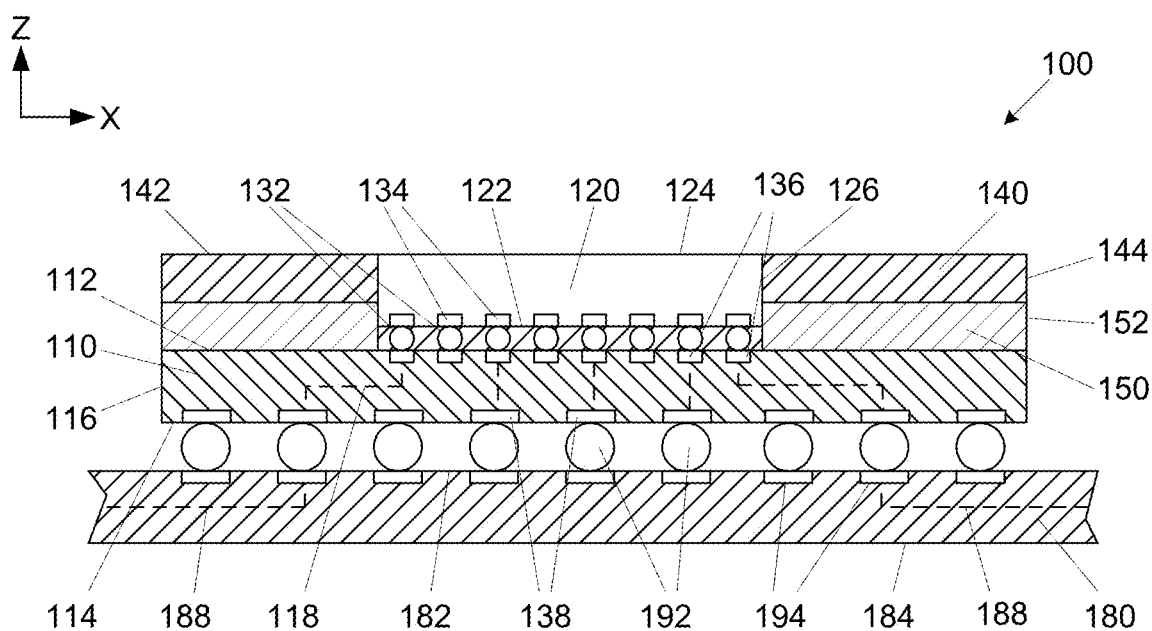
FIG. 14 is a side cross-sectional view of an integrated circuit assembly having a second substrate, according to an embodiment of the present description.

As shown in FIG. 14, the integrated circuit assembly 100 may further include a second substrate 180, wherein the first substrate 110 is electrically attached thereto. The second substrate 180 may be any appropriate structure, including, but not limited to, a motherboard. The second substrate 180 may have a first surface 182 and an opposing second surface 184. The second substrate 180 may be fabricated in a similar manner and with similar materials as discussed with regard to the first substrate 110. The second substrate 180 may further include conductive routes 188 or "metallization" (shown in dashed lines) extending through the second substrate 180. As will be understood to those skilled in the art, the conductive routes 188 of the second substrate 180 may provide electrical communication pathways to external components (not shown). As will be understood to those skilled in the art, the conductive routes 188 may be a combination of conductive traces (not shown) and conductive vias (not shown) extending through the plurality of dielectric material layers (not shown). These conductive traces and conductive vias are well known in the art and are not shown in FIG. 14 for purposes of clarity.

In an embodiment of the present description, the first substrate 110 may be electrically attached to the second substrate 180 with a plurality of substrate-to-substrate interconnects 192. In one embodiment of the present description, the substrate-to-substrate interconnects 192 may extend between the bond pads 138 on the second surface 114 of the first substrate 110 and bond pads 194 on the first surface 182 of the second substrate 180. The substrate-to-substrate interconnects 192 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys).

The embodiments of the present description may provide thermal solutions that can provide for rapid thermal dissipation and temperature control with minimal X, Y, and Z direction restrictions and compatibility with overall thinner and X-Y direction limited systems. Furthermore, the embodiments may be formed at the strip level prior to singulation and thus reduces the assembly process complexity and cost, as will be understood to those skilled in the art. Moreover, the embodiments of the present description may be helpful in integrated circuit package testing, particularly with regard to heat removal from a hot spot.

Figure 15:
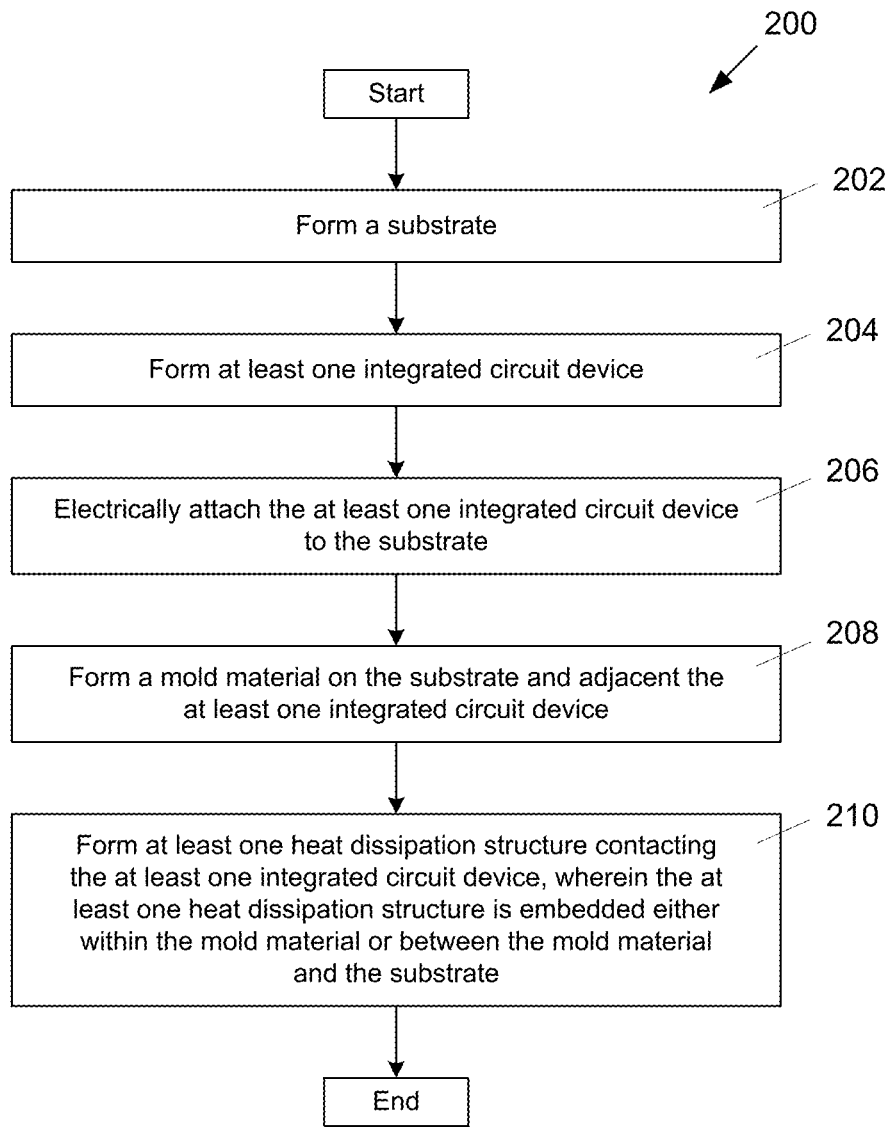
FIGS. 15-18 are flow diagrams methods for fabricating an integrated circuit assembly, according to various embodiments of the present description.

FIG. 15 is a flow chart of a process 200 of fabricating an integrated circuit assembly according to an embodiment of the present description. As set forth in block 202, a substrate may be formed. At least one integrated circuit device may be formed, as set forth in block 204. As set forth in block 206, the at least one integrated circuit device may be attached to the substrate. A mold material may be formed on the substrate and adjacent to the at least one integrated circuit device, as set forth in block 208. As set forth in block 210, at least one heat dissipation structure may be formed to contact the at least one integrated circuit device, wherein the at least one heat dissipation structure is embedded either within the mold material or between the mold material and the substrate.

Figure 16:
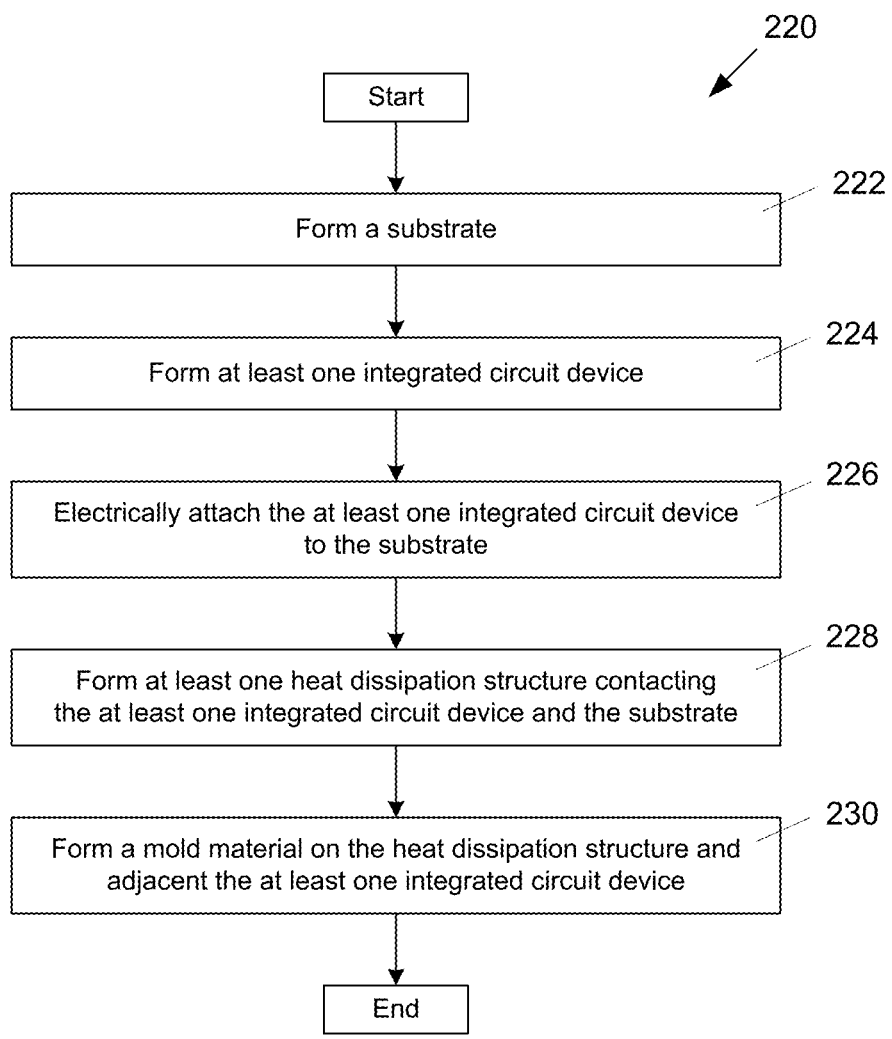

FIG. 16 is a flow chart of a process 220 of fabricating an integrated circuit assembly according to an embodiment of the present description. As set forth in block 222, a substrate may be formed. At least one integrated circuit device may be formed, as set forth in block 224. As set forth in block 226, the at least one integrated circuit device may be attached to the substrate. At least one heat dissipation structure may be formed to contact the at least one integrated circuit device and the substrate, as set forth in block 228. As set forth in block 230, a mold material may be formed on the heat dissipation structure and adjacent to the at least one integrated circuit device.

Figure 17:
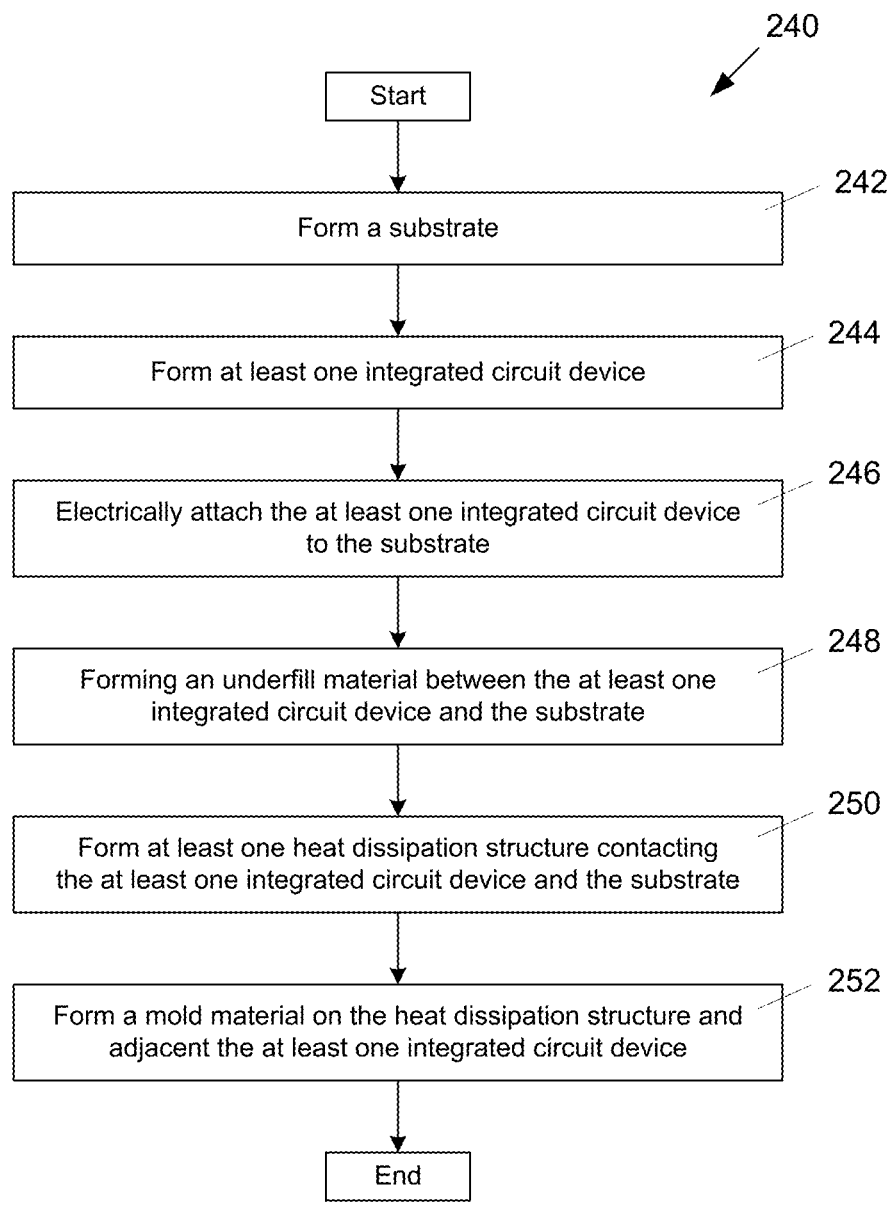

FIG. 17 is a flow chart of a process 240 of fabricating an integrated circuit assembly according to an embodiment of the present description. As set forth in block 242, a substrate may be formed. At least one integrated circuit device may be formed, as set forth in block 244. As set forth in block 226, the at least one integrated circuit device may be attached to the substrate. An underfill material may be formed between the at least one integrated circuit device and the substrate, at set forth in block 248. As set forth in block 250, at least one heat dissipation structure may be formed to contact the at least one integrated circuit device. As set forth in block 252, a mold material may be formed on the heat dissipation structure and adjacent to the at least one integrated circuit device.

Figure 18:
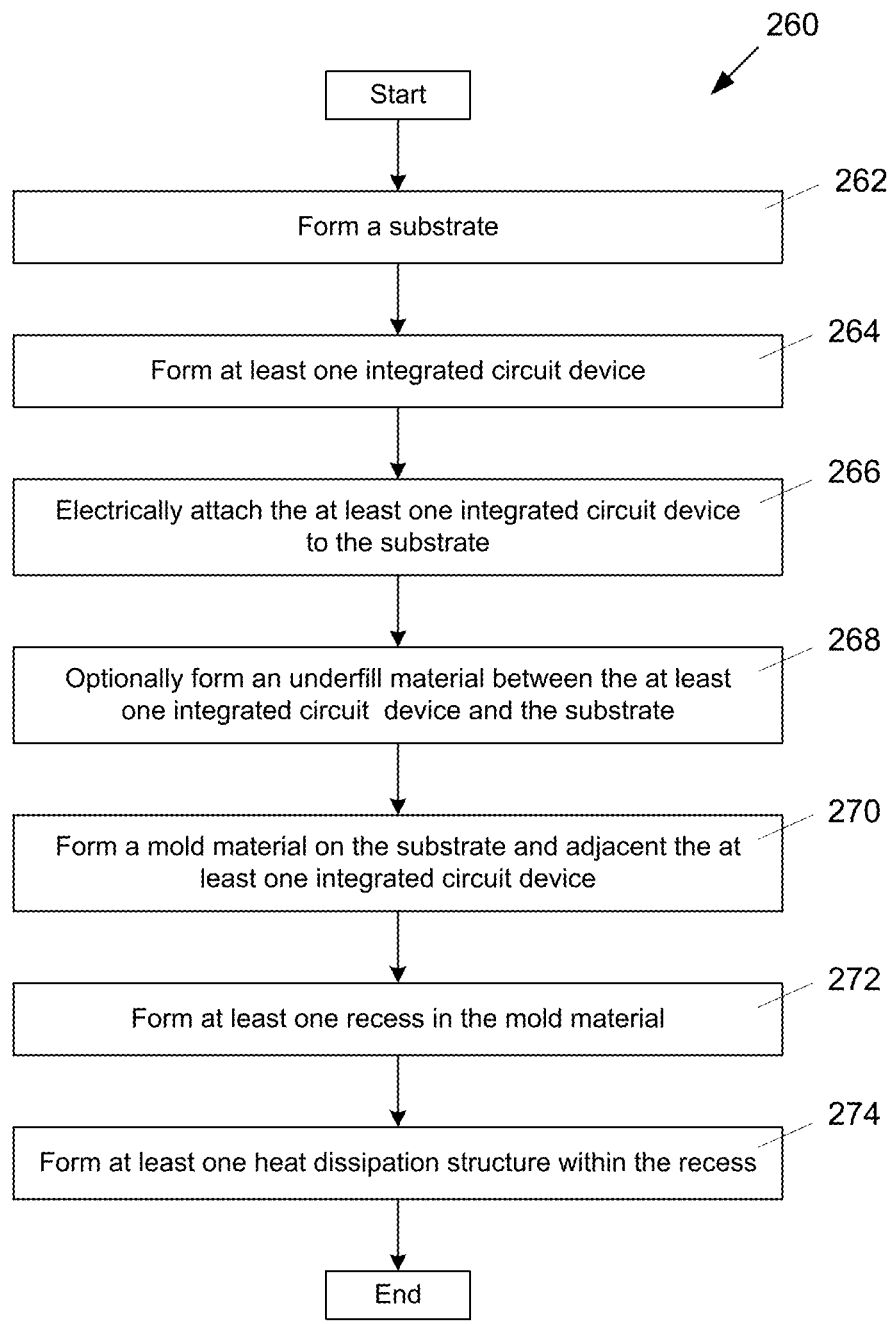

FIG. 18 is a flow chart of a process 260 of fabricating an integrated circuit assembly according to an embodiment of the present description. As set forth in block 262, a substrate may be formed. At least one integrated circuit device may be formed, as set forth in block 264. As set forth in block 266, the at least one integrated circuit device may be attached to the substrate. An underfill material may be optionally formed between the at least one integrated circuit device and the substrate, at set forth in block 268. As set forth in block 270, a mold material may be formed on the substrate and adjacent to the at least one integrated circuit device. At least one recess may be formed in the mold material, as set forth in block 272. As set forth in block 274, at least one heat dissipation structure may be formed within the at least one recess.

Figure 19:
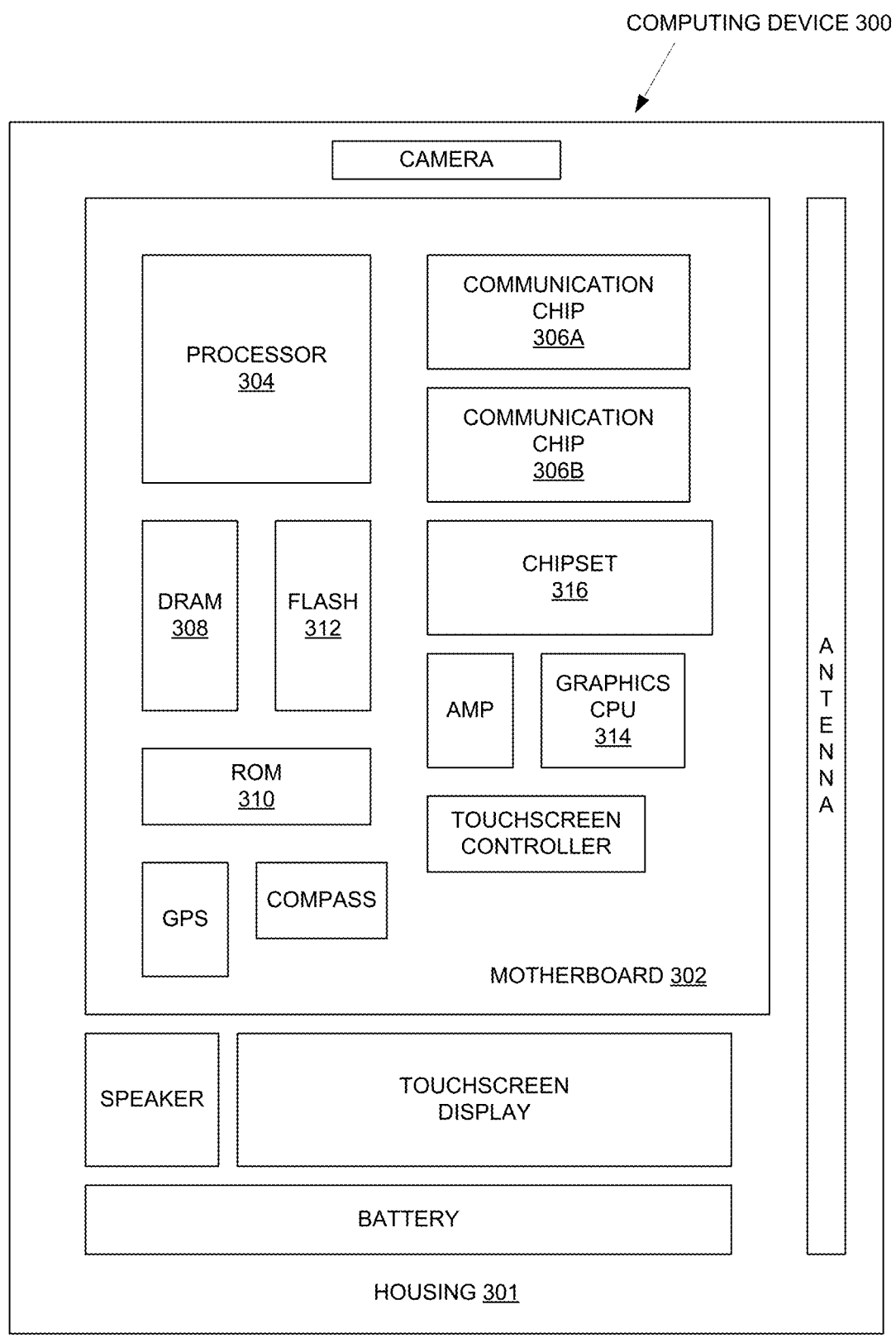
FIG. 19 is an electronic device/system, according to an embodiment of the present description.

FIG. 19 illustrates an electronic or computing device 300 in accordance with one implementation of the present description. The computing device 300 may include a housing 301 having a board 302 disposed therein. The board 302 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly, comprising a substrate core having a first surface and an opposing second surface, at least one heat transfer fluid channel within the substrate core between the first surface and the second surface, a first build-up layer adjacent to the first surface of the substrate core, and a second build-up layer adjacent to the second surface of the substrate core.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-18. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising: a substrate; at least one integrated circuit device, wherein the at least one integrated circuit device is electrically attached to the substrate; a mold material on the substrate and adjacent to the at least one integrated circuit device; and at least one heat dissipation structure contacting the at least one integrated circuit device, wherein the at least one heat dissipation structure is embedded either within the mold material or between the mold material and the substrate.

In Example 2, the subject matter of Example 1 can optionally include the at least one integrated circuit device having a first surface, an opposing second surface, and at least one side extending between the first surface and the second surface, and wherein the at least one heat dissipation structure contacts the first surface of the substrate, the at least one side of the integrated circuit device, and the second surface of the integrated circuit device.

In Example 3, the subject matter of Example 2 can optionally include a portion of the at least one heat dissipation structure extending from the integrated circuit device to a first surface of the mold material.

In Example 4, the subject matter of Example 1 can optionally include the at least one heat dissipation structure extending from the integrated circuit device to a first surface of the mold material.

In Example 5, the subject matter of any of Examples 1 to 4 can optionally include the mold material comprising at least one recess extending into the mold material from a first surface thereof and wherein the at least one heat dissipation structure resides within the at least one recess.

In Example 6, the subject matter of any of Examples 1 to 5 can optionally include the at least one heat dissipation structure comprising a plurality of thermally conductive routes extending from the at least one integrated circuit device to a side of the substrate.

In Example 7, the subject matter of any of Examples 1 to 5 can optionally include the at least one heat dissipation structure comprising a single structure.

In Example 8, an electronic system may comprise a board and an integrated circuit package electrically attached to the board, wherein the integrated circuit package comprises a substrate; at least one integrated circuit device, wherein the at least one integrated circuit device is electrically attached to the substrate; a mold material on the substrate and adjacent to the at least one integrated circuit device; and at least one heat dissipation structure contacting the at least one integrated circuit device, wherein the at least one heat dissipation structure is embedded either within the mold material or between the mold material and the substrate.

In Example 9, the subject matter of Example 8 can optionally include the at least one integrated circuit device having a first surface, an opposing second surface, and at least one side extending between the first surface and the second surface, and wherein the at least one heat dissipation structure contacts the first surface of the substrate, the at least one side of the integrated circuit device, and the second surface of the integrated circuit device.

In Example 10, the subject matter of Example 9 can optionally include a portion of the at least one heat dissipation structure extending from the integrated circuit device to a first surface of the mold material.

In Example 11, the subject matter of Example 8 can optionally include the at least one heat dissipation structure extending from the integrated circuit device to a first surface of the mold material.

In Example 12, the subject matter of any of Examples 8 to 11 can optionally include the mold material comprising at least one recess extending into the mold material from a first surface thereof and wherein the at least one heat dissipation structure resides within the at least one recess.

In Example 13, the subject matter of any of Examples 8 to 12 can optionally include the at least one heat dissipation structure comprising a plurality of thermally conductive routes extending from the at least one integrated circuit device to a side of the substrate.

In Example 14, the subject matter of any of Examples 8 to 12 can optionally include the at least one heat dissipation structure comprising a single structure.

In Example 15, a method of fabricating an integrated circuit assembly may comprise forming a substrate; forming at least one integrated circuit device; electrically attaching the at least one integrated circuit device to the substrate; forming a mold material on the substrate and adjacent to the at least one integrated circuit device; and forming at least one heat dissipation structure contacting the at least one integrated circuit device, wherein the at least one heat dissipation structure is embedded either within the mold material or between the mold material and the substrate.

In Example 16, the subject matter of Example 15 can optionally include forming the at least one integrated circuit device to have a first surface, an opposing second surface, and at least one side extending between the first surface and the second surface, and wherein forming the at least one heat dissipation structure comprises forming the at least one heat dissipation structure to contact the first surface of the substrate, the at least one side of the integrated circuit device, and the second surface of the integrated circuit device.

In Example 17, the subject matter of Example 16 can optionally include forming a portion of the at least one heat dissipation structure to extend from the integrated circuit device to a first surface of the mold material.

In Example 18, the subject matter of Example 15 can optionally include forming the at least one heat dissipation structure to extend from the integrated circuit device to a first surface of the mold material.

In Example 19, the subject matter of any of Examples 15 to 18 can optionally include forming at least one recess extending into the mold material from a first surface thereof and forming the at least one heat dissipation structure to reside within the at least one recess.

In Example 20, the subject matter of any of Examples 15 to 19 can optionally include forming the at least one heat dissipation structure by forming a plurality of thermally conductive routes extending from the at least one integrated circuit device to a side of the substrate.

In Example 21, the subject matter of any of Examples 5 to 19 can optionally include forming the at least one heat dissipation structure by forming a single structure.

Having thus described in detail embodiments of the present invention, it is understood that the invention defined by the appended claims is not to be limited by particular details set forth in the above description, as many apparent variations thereof are possible without departing from the spirit or scope thereof

What is claimed is:
1. An integrated circuit assembly, comprising:
a substrate;
at least one integrated circuit device coupled to the substrate, wherein the integrated circuit device has a first surface adjacent to the substrate, an opposing second surface, and at least one side extending between the first and second surfaces;
at least one heat dissipation structure in contact with the side of the integrated circuit device; and
a mold material over the at least one heat dissipation structure, wherein the at least one heat dissipation structure is embedded between the mold material and the substrate such that the mold material has a top surface over a top surface of the at least one heat dissipation structure, and wherein the top surface of the mold material is substantially planar with the second surface of the integrated circuit device.

2. The integrated circuit assembly of claim 1, wherein the at least one heat dissipation structure is in contact with a surface of the substrate.

3. The integrated circuit assembly of claim 1, wherein the at least one heat dissipation structure comprises a plurality of thermally conductive routes each extending from the side of the at least one integrated circuit device.

4. The integrated circuit assembly of claim 3, wherein an average width of the thermally conductive routes is less than an average length of the thermally conductive routes.

5. The integrated circuit assembly of claim 3, wherein an average width of the thermally conductive routes is greater than an average length of the thermally conductive routes.

6. The integrated circuit assembly of claim 1, wherein the at least one heat dissipation structure comprises a single structure extending from all sides of the at least one integrated circuit device.

7. The integrated circuit assembly of claim 1, wherein the at least one heat dissipation structure comprises a plurality of thermally conductive routes each extending from a position of the at least one integrated circuit device proximal to a hotspot of the at least one integrated circuit device.

8. An integrated circuit assembly, comprising:
a substrate;
at least one integrated circuit device coupled to a surface of the substrate, wherein the integrated circuit device has a first surface adjacent to the surface of the substrate, an opposing second surface, and at least one side extending between the first and second surfaces;
at least one heat dissipation structure on the surface of the substrate, in contact with the side of the integrated circuit device, and in contact with a first portion of the second surface of the integrated circuit device; and
a mold material on the at least one heat dissipation structure, wherein the mold material is in contact with a second portion of the second surface of the integrated circuit device.

9. The integrated circuit assembly of claim 8, wherein the at least one heat dissipation structure is embedded between the mold material and the substrate and between the mold material and the integrated circuit device such that the mold material has a top surface over a top surface of the at least one heat dissipation structure.

10. The integrated circuit assembly of claim 9, further comprising a second heat dissipation structure on a third portion of the second surface of the integrated circuit device, the second heat dissipation structure embedded within the mold material and such that the top surface of the mold material is over a top surface of the second heat dissipation structure.

11. The integrated circuit assembly of claim 8, wherein a portion of the at least one heat dissipation structure extends from the first portion of the second surface of the integrated circuit device to a top surface of the mold material.

12. The integrated circuit assembly of claim 11, further comprising a second heat dissipation structure on a third portion of the second surface of the integrated circuit device, wherein the second heat dissipation structure extends from the third portion of the second surface of the integrated circuit device to the top surface of the mold material.

13. The integrated circuit assembly of claim 8, wherein the at least one heat dissipation structure comprises a plurality of thermally conductive routes each extending from the side of the at least one integrated circuit device.

14. The integrated circuit assembly of claim 8, wherein the at least one heat dissipation structure comprises a plurality of thermally conductive routes each extending from the first portion, the first portion comprising a hotspot of the at least one integrated circuit device.

15. An integrated circuit assembly, comprising:
a substrate;
at least one integrated circuit device coupled to a surface of the substrate, wherein the integrated circuit device has a first surface adjacent to the surface of the substrate, an opposing second surface, and at least one side extending between the first and second surfaces;
a mold material on the surface of the substrate, on a first portion of the second surface of the integrated circuit device, and adjacent to the at least one integrated circuit device, wherein the mold material comprises at least one recess extending into the mold material from a first surface thereof, the recess over a second portion of the integrated circuit device; and
at least one heat dissipation structure in the recess and on the second portion of the second surface of the integrated circuit device, wherein the at least one heat dissipation structure extends from the second portion of the second surface of the integrated circuit device onto the side of the at least one heat dissipation structure.

16. The integrated circuit assembly of claim 15, wherein the at least one heat dissipation structure further extends onto the mold material.

17. The integrated circuit assembly of claim 15, wherein the mold material is between the surface of the substrate and the first surface of the integrated circuit device.

18. The integrated circuit assembly of claim 17, wherein the substrate and the integrated circuit device are coupled by interconnects extending through the mold material.

19. The integrated circuit assembly of claim 15, wherein the at least one heat dissipation structure comprises a plurality of thermally conductive routes extending from the at least one integrated circuit device.

20. The integrated circuit assembly of claim 15, wherein the at least one heat dissipation structure comprises a plurality of thermally conductive routes each extending from the first portion, the first portion comprising a hotspot of the at least one integrated circuit device.

* * * * *